United States Patent [19]
Henker

[11] 3,776,788

[45] Dec. 4, 1973

[54] METHOD OF PRODUCING INSULATED SEMICONDUCTOR REGIONS

[75] Inventor: Heinz Henker, Munich, Germany

[73] Assignee: Siemens Aktiengesellschaft, Berlin and Munich, Germany

[22] Filed: Mar. 22, 1971

[21] Appl. No.: 126,724

[30] Foreign Application Priority Data

Mar. 20, 1970 Germany .................. P 20 13 546.0

[52] U.S. Cl. .................... 156/17, 148/175, 204/143, 29/148.5

[51] Int. Cl. .............................................. H01l 7/50

[58] Field of Search ...................... 156/17; 29/148.5; 204/143; 148/175

[56] References Cited

UNITED STATES PATENTS 3,536,600 10/1970 Van Dijk et al. .................. 204/143

*Primary Examiner*—Jacob H. Steinberg

*Attorney*—Curt M. Avery, Arthur E. Wilfond, Herbert L. Lerner and Daniel J. Tick

[57] ABSTRACT

A process for producing insulated semiconductor regions. To produce an insulated region on a semiconductor wafer, a semiconductor substrate of one conductance type is etched to the region of opposite conductance type. The etching process stops at the pn-junction. The polycrystalline semiconductor layer is separated by the etchant through an insulating layer. The invention is particularly suitable for the production of multiple structures in a semiconductor wafer.

4 Claims, 11 Drawing Figures

METHOD OF PRODUCING INSULATED SEMICONDUCTOR REGIONS

The invention relates to a method of producing insulated semiconductor regions for a monolythic semiconductor circuit.

ELECTRONICS, June 1964, page 23, describes a method for forming insulated parts of integrated circuits. This method starts with a wafer of monocrystalline silicon. Thereafter, using the conventional technique, the surface of these wafers is provided with etched-in pits which correspond to the image of the desired structure of the individual, mutually insulated regions. The thus fashioned surface is coated with a layer of silicon dioxide 1 to 5 $\mu$ thick. The wafer is then placed in an *r-f* furnace and polycrystalline silicon is deposited upon the isolating layer. Finally, the wafer which originally acted as a carrier is removed through lapping or etching leaving completely isolated regions situated between pits. The thus obtained, mutually insulated, monocrystalline regions serve for receiving the individual components, for example a diode for producing a p-n junction.

Particularly critical are the last steps of the above-described method. The formation of the various layers on the wafer, as for example the masking layer for producing the pits, or of the indicated layer of silicon dioxide, results in the surface of the wafer no longer being planar but having the form of a spherical calotte. However, since the lapping or polishing machines used for the removal of the monocrystalline layer, produce only planar faces, a different removal occurs in the center of the arched wafer than at its edge. This is undesired in connection with the precision which is aimed at in integrated circuits.

As previously stated, it is also known from ELECTRONICS to etch the monocrystalline semiconductor regions. This method is not used much, in practice, since firstly due to the all-over equal etching speed, the arched wafer inserted into the etchant, is separated in a plane and secondly, the respectively attained etching depth is hard to control.

It is also known to electrically insulate individual components of an integrated circuit, from each other. A disadvantage of such an arragement lies in the fact that, in order to obtain the intended successful insulation, the p-n junction must be constantly biased.

It is an object of the invention to provide a method which permits the production of insulated semiconductor regions, in a simple manner. The method of the invention particularly aims to avoid the above-indicated shortcomings and disadvantages.

The task is met through the following steps:

a. applying a mask of insulating material on a semiconductor substrate of one conductance type;

b. epitaxically precipitating monocrystalline zones of the other conductance type upon regions of the semiconductor surface that are not covered by the mask;

c. coating the thus produced arrangement with an insulating layer;

d. precipitating semiconductor material upon the insulating layer, so that a polycrystalline layer develops; and e. etching the semiconductor substrate.

The insulated semiconductor regions are so produced thereby that the etching process for removing the semiconductor substrate of the monocrystalline layer stops on its own, at the predetermined limit or at least slows down considerably. When an appropriate etchant is selected which differs depending on whether the semiconductor substrate is n-conductive, p-conductive, highly or weakly doped, the etching process will virtually stop exactly when the p-n junction is reached since the etching speed for the following, oppositely doped material is considerably lower. With the aid of this method, the semiconductor substrate is completely removed even when the wafer is curved or distorted so that the insulated, grown monocrystalline regions which are embedded into the polycrystalline layer, remain. According to a further feature of the invention, and prior to the application of the mask of insulating material upon the semiconductor substrate, a semiconductor layer of the other conductance type, preferably about 2 to 5 $\mu m$ in thickness, is precipitated and is etched away following the etching of the semiconductor substrate.

This method is preferred especially when the precipitated monocrystalline zones of the other conductance type are to be p-conducting. In this case, the semiconductor layer is n-conducting, while the semiconductor substrate is p-conducting. It was found that the material removed by etching, is easier to arrest at the junction from the p to the n-conducting regions, than in a reversed layer sequence. The insertion of the semiconductor layer, produces a p-n junction between the semiconductor substrate and the semiconductor layer, the removal of material by etching stops of its own or is considerably slowed down so that differences in the etching speed on the semiconductor substrate balance themselves out. Subsequently, the semiconductor layer, which forms a thin intermediate layer is etched off, for example, with the aid of a non-selective etchant or possibly by utilizing the effect of the p-n junction which halts the etching from the n-conducting semiconductor layer to the p-conducting semiconductor substrate. A smaller difference in the etching speeds, in this layer sequence has no disturbing effect, due to the slight thickness of the intermediate layer.

According to another feature of the present invention, the p-n junction which forms between the semiconductor layer and the semiconductor substrate during the etching off of the semiconductor substrate is biased in blocking direction. This may further increase the effect of the p-n junction which slows the etching process.

It is expedient to use for the mask and the insulating layer, silicon oxide, aluminum oxide or a mixture of both oxides. Moreover, a protective layer applied onto the polycrystalline side should prevent the etchant from attacking the polycrystalline material. This task is solved particularly well by the indicated layers.

Finally, the invention is not limited to the removal of the semiconductor substrate by etching alone. It is also an object of the present invention to remove a first part of the semiconductor substrate by mechanical means, for example by lapping and only then to remove the portion of the semiconductor substrate which is adjacent the polycrystalline layer, through etching.

Other features and details of the invention are derived from the following disclosure of an embodiment, with reference to the Figures, wherein:

FIGS. 6 to 10 illustrate in section a second embodiment of the invention; and

Figure 1:
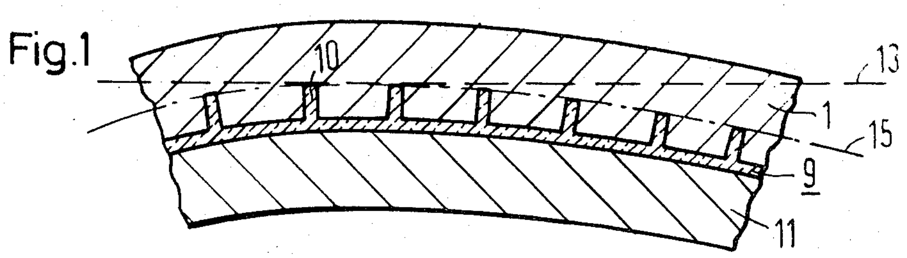
FIG. 1 is a section through a curved semiconductor layer.

In FIG. 1 a curved semiconductor wafer is shown in section. An insulated layer 9 lies between one layer 11 of polycrystalline silicon and a semiconductor substrate 1 of monocrystalline silicon. The insulating layer 9 has toothed intermediate walls 10, which reach into the semiconductor substrate 1 and serve to insulate the individual regions. When the semiconductor substrate 1 of this wafer is separated in FIG. 1, above the plane indicated by broken line 13, which may be effected through lapping, then only the intermediate walls 10 which are positioned in the center of the wafer emerge to the surface. It is obvious that this cannot result in an insulation of the regions located at the edge of the wafer, since there the intermediate walls near the edge do not emerge to the surface, established by line 13.

The following shows the invention in two embodiments and illustrates that according to the invention, even the substrate of a curved semiconductor wafer may be removed uniformly, approximately up to the area of a spherical calotte indicated in FIG. 1, by a dash-dotted line 15.

Figure 2:
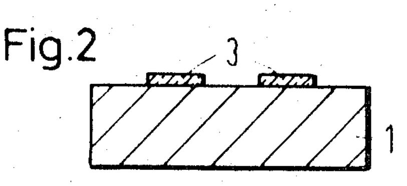
FIGS. 2 to 5 and 10 illustrate in section a first embodiment of the invention.
Figure 11:
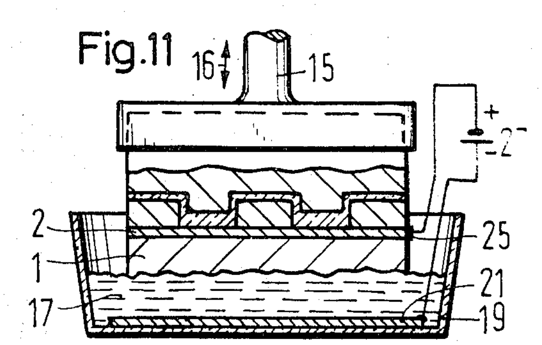
FIG. 11 illustrates a device for performing the method of the invention.

Similar parts in FIGS. 2 and 11 are given reference numerals corresponding to parts of FIG. 1.

Figure 3:
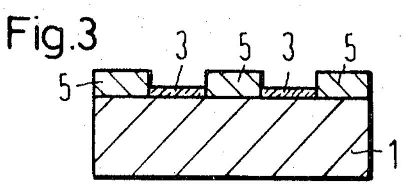
Figure 4:
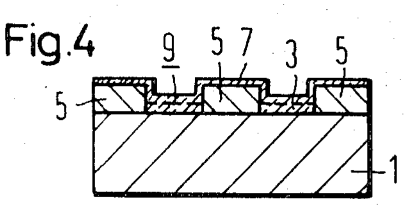
Figure 5:
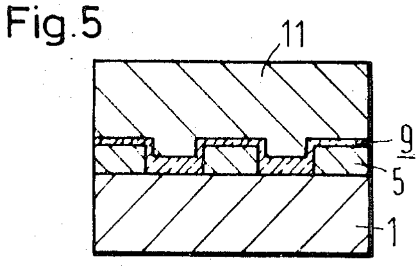
Figure 9:
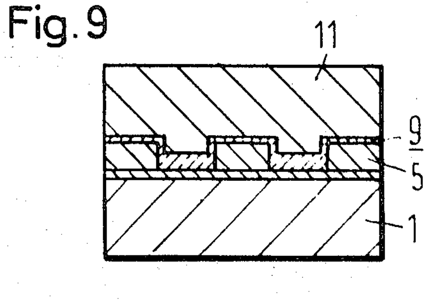

First, a semiconductor substrate 1 consisting of p-conducting monocrystalline silicon is provided with a mask 3 of silicon dioxide or another suitable insulating material such as aluminum oxide (see FIG. 2), whereby the regions which are later needed for the components remain exposed. On the surfaces not covered with the insulating material of the mask 3 one or more monocrystalline zones 5 possibly differently doped, are precipitated by selective epitaxy (FIG. 3). The surface of this device as shown in FIG. 4 is then coated with a heat resistant insulating layer 7 of silicon dioxide. This may be done, for example, through oxidation, vapor-deposition, sputtering or pyrolytic dissociation. The insulating layer 7 united thereby with the mask 3, forming an insulating layer 9. Subsequently, more silicon is precipitated on this insulating layer 9. This grows polycrystalline, thus resulting in the polycrystalline layer 11. The layer 11 must be made so thick that later it may, by itself, carry the mutually insulated monocrystalline regions (FIG. 5). In a last method step, the monocrystalline semiconductor substrate is finally etched off (FIG. 10), by chosing an appropriate etchant which is variably selected, depending on whether the semiconductor substrate 1 is n-conducting. p-conducting, high or low ohmic, the etching process will cease when a p-n junction is obtained between the semiconductor substrate 1 and the zones 5 or will be slowed down so that curved faces may also be produced. The layer 11 must then be covered by a layer that resists the etchant.

The second embodiment will now be illustrated with reference to FIGS. 6 to 10.

Figure 6:
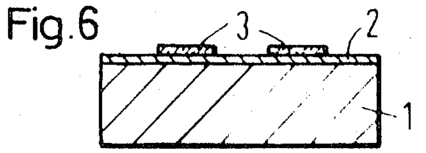
Figure 7:
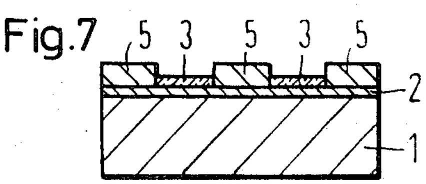
Figure 8:
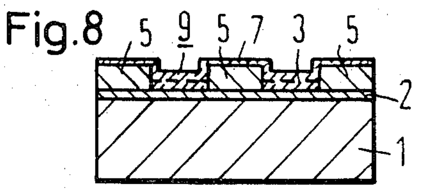

First, the semiconductor substrate 1 which must again be p-conductive is epitaxially coated with a thin, n-conducting semiconductor layer 2 several $\mu$m in thickness. The mask 3 is then applied as in the first embodiment (FIG. 6). With the aid of the selective epitaxy, the monocrystalline zones 5 are produced (FIG. 7). The device is then coated with the insulating layer 7 which forms an insulating layer 9 with the mask 3 (FIG. 8). Finally, the polycrystalline layer 11 is precipitated upon the insulating layer 9. These last method steps correspond completely to the method steps described in the first embodiment. They differ only through the arrangement of the semiconductor layer 2, which acts as an intermediate layer.

The semiconductor layer 2 has the function to stop the etching process. Based on experience, this is easier when etching is effected from a p-conducting region to an n-conducting region.

Therefore, the p-conducting semiconductor substrate 1 is first etched up to the border to the n-conducting semiconductor layer 2. At this boundary, the etching stops on its own, as previously mentioned or is being exceptionally slowed down so that the differences in the etching speed will be corrected on their own.

Figure 10:
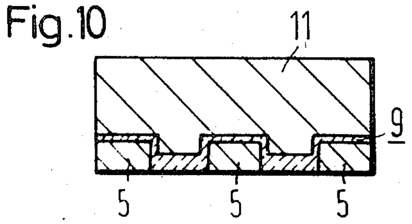

Subsequently, the thin semiconductor layer 2 is etched off. This may be effected with a non-selective etchant or by utilizing the braking effect of the p-n junction, between semiconductor layer 2 and zones 5. Due to the slight thickness of the semiconductor layer 2 for the insulated region, differences in the etching velocity have no disturbing effect. Hence, the device according to FIG. 10 is obtained as in the first embodiment.

FIG. 11 shows a device for performing the method. A semiconductor wafer is clamped into a holding device 15 which is movable according to arrow 16, during the etching of the semiconductor substrate 1. The etchant 17 is situated in a tub 19 of insulating non-etchable material. Furthermore, to increase the effect of the p-n junction which slows the etching process between the semiconductor substrate 1 and the semiconductor layer 2, the p-n junction is biased in blocking direction. To this end, an electrode is provided on the bottom of the tub 19, while a contact 25 is arranged on the semiconductor layer 2. Since the semiconductor substrate 1 is p-conducting and the semiconductor layer is n-conducting, the electrode 21 is connected with the negative pole and contact 25 with the positive pole of a battery 27.

With the method suggested by the present invention, the semiconductor substrate may be completely removed, even in a distorted wafer so that only the mutually insulated, monocrystalline regions remain embedded in the polycrystalline material.

I claim:

1. Process for producing insulated semiconductor regions for monolithic semiconductor circuits which comprises:

a. applying on a silicon semiconductor substrate of one conductance type a semiconductor layer 2 to 5 $\mu$ thick of opposite conductance type;

b. applying a mask of insulating material selected from $SiO_2$, $Al_2O_3$ and mixtures thereof on the semiconductor layer;

c. epitaxially precipitating monocrystalline zones of the one conductance type upon regions of the semiconductor layer not covered by said mask;

d. coating the product of (c) with an insulating layer;

e. precipitating semiconductor material upon the insulating layer to form a polycrystalline silicon layer;

f. while biasing in the blocking direction the p-n junction formed between the semiconductor layer and the semiconductor substrate, electro-etching away the semiconductor substrate; and g. etching away the semiconductor layer.

2. The process of claim 1, wherein the semiconductor substrate is p-doped and the semiconductor layer is n-doped.

3. The process of claim 1 wherein the etching of the semiconductor substrate is by means of a suitable etchant for said substrate.

4. The process of claim 1, wherein a portion of the semiconductor substrate is mechanically removed.

* * * * *